(12) United States Patent
Yoshimatsu

(10) Patent No.: US 7,660,257 B2
(45) Date of Patent: Feb. 9, 2010

(54) SEMICONDUCTOR DEVICE AND TEST METHOD OF SEMICONDUCTOR DEVICE

(75) Inventor: Takanori Yoshimatsu, Kanagawa-ken (JP)

(73) Assignee: Kabushiki Kaisha Toshiba (JP)

(*) Notice: Subject to any disclaimer, the term of this patent is extended or adjusted under 35 U.S.C. 154(b) by 577 days.

(21) Appl. No.: 11/388,479

(22) Filed: Mar. 23, 2006

(65) Prior Publication Data

US 2007/0007521 A1 Jan. 11, 2007

(30) Foreign Application Priority Data

Mar. 25, 2005 (JP) .................. P2005-089485

(51) Int. Cl.
*G08C 15/00* (2006.01)
(52) U.S. Cl. .................. 370/241; 257/48
(58) Field of Classification Search .............. None
See application file for complete search history.

(56) References Cited

U.S. PATENT DOCUMENTS

| | | | |
|---|---|---|---|
| 4,510,673 A | | 4/1985 | Shils et al. |
| 5,298,433 A | * | 3/1994 | Furuyama ............ 438/6 |
| 5,867,505 A | * | 2/1999 | Beffa ............ 714/718 |
| 5,966,459 A | * | 10/1999 | Chen et al. ............ 382/149 |
| 6,119,049 A | | 9/2000 | Peddle |
| 2004/0088074 A1 | | 5/2004 | Chen et al. |

OTHER PUBLICATIONS

Dawn et al, Flash Memory Die Sort by a Sample Classification Method, IEEE, 6 pages, 2005.*

* cited by examiner

*Primary Examiner*—Frank Duong
(74) *Attorney, Agent, or Firm*—DLA Piper LLP (US)

(57) ABSTRACT

There is provided a semiconductor device comprising, a function unit portion including a circuit element, rank data presenting results of a rank-classification test on the circuit element, the rank-classification test being performed on the basis of a plurality of test criteria on wafer state, a non-volatile memory portion in which the rank data are stored, and a control portion reading out the rank data from the non-volatile memory portion, the control portion being used in a product test after packaging.

17 Claims, 4 Drawing Sheets

(a) User Specification

|  | User A | User B | User C |
|---|---|---|---|
| Pause Time | 32ms | 1024ms | 128ms |
| Access Time | 30ns | 60ns | 40ns |

(b) Selection by Rank Data

|  | User A Test | User B Test | User C Test |
|---|---|---|---|
| Pause Time | Rank D | Rank A | Rank C |
| Access Time | Rank A | Rank D | Rank B |

FIG. 6

SEMICONDUCTOR DEVICE AND TEST METHOD OF SEMICONDUCTOR DEVICE

CROSS REFERENCE TO RELATED APPLICATION

This application is based upon and claims the benefit of priority from the prior Japanese Application (No. 2005-89485, filed on Mar. 25, 2005), the entire contents of which are incorporated herein by reference.

FIELD OF THE INVENTION

The present invention relates to a semiconductor device having a function classifying chips.

DESCRIPTION OF THE BACKGROUND

In conventional semiconductor devices having a function classifying chips and conventional test methods of the semiconductor devices, classification information such as chip ID or the like and quality information on result of a test on wafer state or the like are written in a non-volatile memory portion such as a fuse after finishing wafer processes. The information are read from the non-volatile memory portion so as to be used for improvement of assembly processes or defect analysis after finishing packaging (for references, Japanese Patent Unexamined Publication (Kokai) No. H8-213464 and Japanese Patent Unexamined Publication (Kokai) No. 2004-40103).

However, a hard test cannot be performed on wafer state before packaging processes. Accordingly, a simple functional test is only carried out in conventional semiconductor devices and conventional test methods. Especially, semiconductor devices having a DRAM portion are examined by die sort test (D/S test) with harder specifications on proper test items of DRAM cell, such as pause time or access time, on wafer state. This is because a slight deviation of process parameters in wafer processes produces larger variations in DRAM performance.

In spite of the hard test, conventional semiconductor devices and conventional test methods cause lower yield of DRAM products by the variations in DRAM performance in a test with the test items after packaging processes (product test).

Furthermore, a product specification of DRAM is often classified into several kinds of the ranks, since each one of the test items has large variations in performance. Therefore, the product test is carried out by a special specification for combination of user specific requirement. Accordingly, the product test produces lower yield of or longer delivery period for shipping products.

SUMMARY OF THE INVENTION

According to an aspect of the invention, there is provided, a semiconductor device including a function unit portion including a circuit element, rank data presenting results of a rank-classification test on the circuit element, the rank-classification test being performed on the basis of a plurality of test criteria on wafer state, a non-volatile memory portion in which the rank data are stored and a control portion reading out the rank data from the non-volatile memory portion, the control portion being used in a product test after packaging.

Further, another aspect of the invention, there is provided a test method of a semiconductor device including, performing a rank-classification test on a circuit element included in a chip portion on wafer state on the basis of a plurality of test criteria, and writing results of the rank-classification test as rank data into the non-volatile memory portion so that the rank data are stored in the non-volatile memory portion.

BRIEF DESCRIPTION OF THE DRAWINGS

FIG. 6 shows a table showing selection, for example on the basis of a user requirement specification and rank data in the test method of the semiconductor device according to the second embodiment of the present invention.

DETAILED DESCRIPTION OF THE INVENTION

Embodiments of the present invention will be described hereinafter in detail with reference to the accompanying drawings mentioned above.

Figure 1:
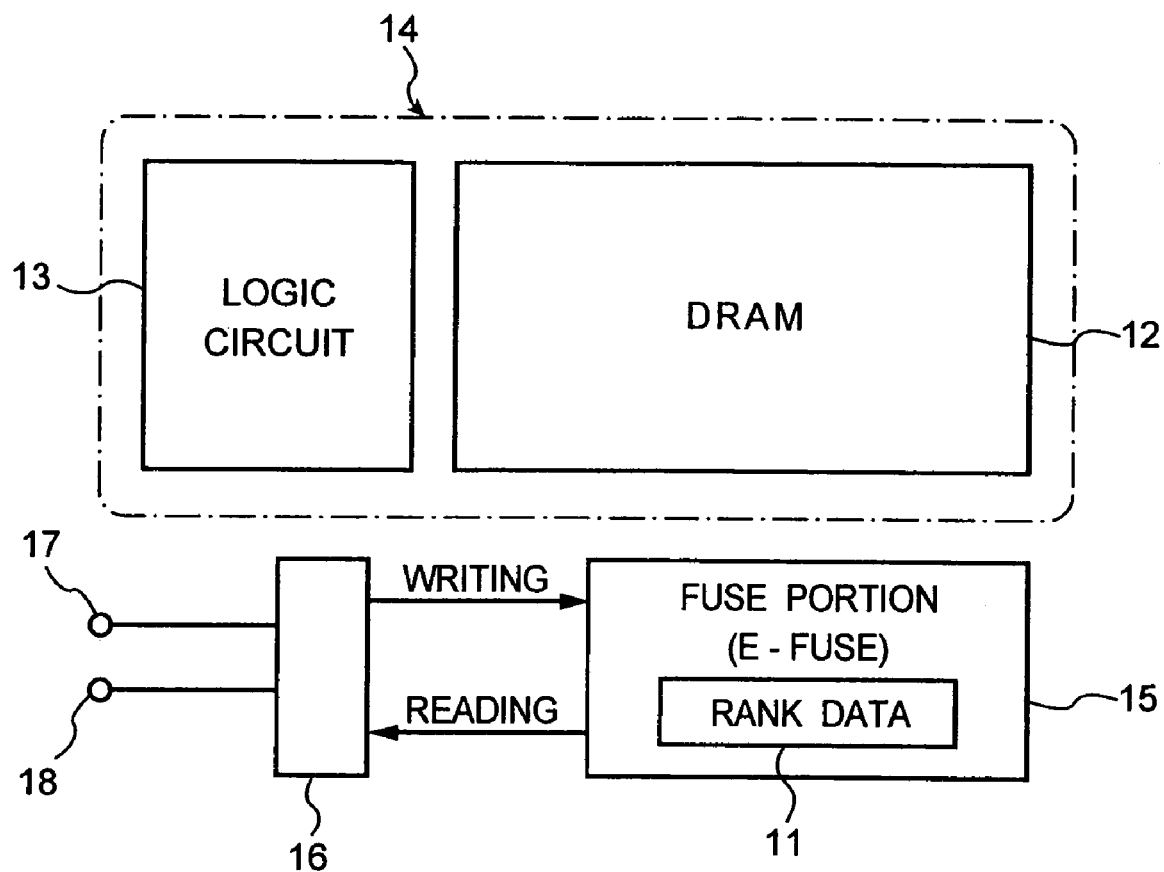
FIG. 1 shows a circuit block diagram showing a semiconductor device according to a first embodiment of the present invention.

FIG. 1 is a circuit block diagram showing a semiconductor device according to a first embodiment of the present invention. This figure mainly illustrates a portion regarding a rank-classification test and a rank data 11 obtained by the test. For example, the rank-classification test of a semiconductor device having a function unit 14 being embedded with a DRAM potion 12 and a logic circuit 13 is illustrated.

The semiconductor device according to the first embodiment of the present invention includes the function unit 14 having the DRAM portion 12 and the logic circuit 13, a fuse portion 15 being stored the rank data 11 and a control circuit 16 for accessing to the fuse portion 15.

A control input of the control circuit 16 is connected to a control terminal 17 and a data input-output portion (not illustrated) is connected to an input-output terminal 18 to communicate data with an exterior portion. Further, reading data being received from the fuse portion 15 is input to the data input portion (not illustrated) of the control circuit 16 and writing data being received from the data output portion (not illustrated) is supplied to the fuse portion 15.

The function unit 14 is a circuit portion which realizes an inherent function of a chip and the function unit 14 includes the DRAM portion 12 being subjected to the rank-classification test and the logic circuit 13.

The fuse portion 15 is composed of a plurality of electrical fuses memorizing the rank data 11 and a periphery circuit of the electrical fuses. The electrical fuses are electrically cut by the rank data 11 being received from the control circuit 16, so that the rank data 11 are stored in the fuse portion 15. Moreover, the fuse portion 15 supplies the rank data 11 read from the electrical fuse to the control circuit 16.

The control circuit 16 communicates the rank data 11 via the input-output terminal 18 with an exterior portion on the basis of the control signal received from the exterior portion via the terminal 17. The control circuit 16 controls the fuse portion 15 where the rank data 11 are written or read between the electrical fuses and the control circuit 16.

Figures 2, 3:
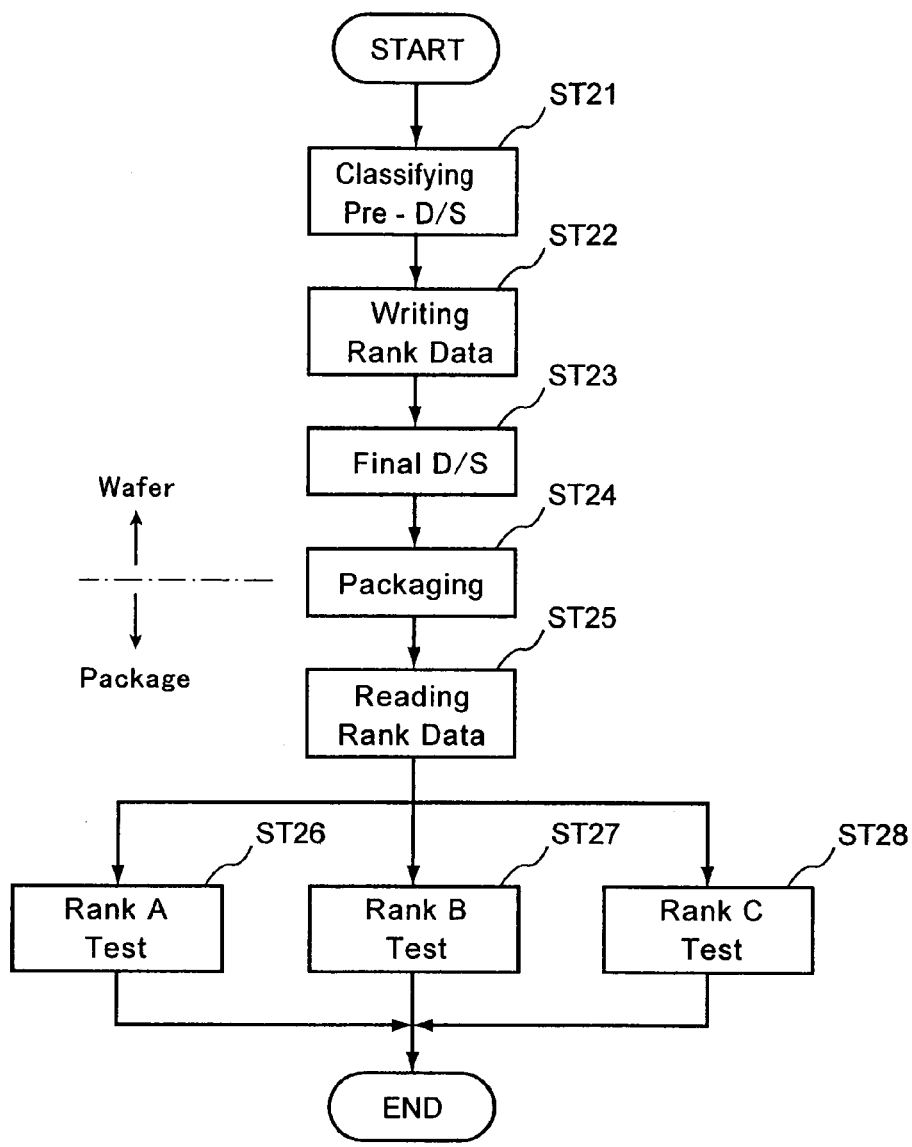
FIG. 2 shows a flowchart showing a test method of the semiconductor device according to the first embodiment of the present invention.
FIG. 3 shows a table showing a rank classification and test criteria of a rank test in the test method of the semiconductor device according to the first embodiment of the present invention.

Next, a test method on the semiconductor device having the structure mentioned above is explained. FIG. 2 shows a flow-chart showing the test method of the semiconductor device according to the first embodiment of the present invention. This figure mainly illustrates a portion regarding the rank-classification test in D/S test and a rank test in a product test. For example, it is demonstrated that the data are classified into four ranks (rank A to rank D) on the basis of three test criteria as shown in FIG. 3.

As shown in FIG. 2, tests in ST21-ST23 are carried out on wafer state and tests in ST26-ST28 are carried out on package state.

The test method of the semiconductor device according to the first embodiment of the present invention includes a wafer test step (ST21), a writing step (ST22), a final D/S step (ST23), a packaging step (ST24), a reading step (ST25) and a rank test step (ST26-28).

In ST21, the rank-classification test of the function unit 14 is performed besides conventional pre-D/S test by use of test equipment. The rank-classification test is performed for one test item by use of a plurality of test criteria. Each one of chip portions in the wafer is classified into four ranks (for example, rank A-rank D). In detail, it is mentioned in FIG. 3 by using a specific example.

The rank data 11 of each chip portion classified into the ranks in ST21 are stored in the fuse portion 15 in ST22.

In ST23, the semiconductor device is finally tested on wafer state and the test includes conformation on normally writing operation in ST22.

In ST24, the wafer is divided into a plurality of chips, and each of chips is encapsulated into a molding resin or the like and is packaged.

A product packaged in ST24 is classified on the basis of the rank data 11 before a product test. In FIG. 2, the product is classified into three product tests, for example. In ST25, the rank data 11 are read from the fuse portion 15, a product test in ST26-ST28 is selected on the basis of the data.

In ST26, the product test also having the conventional product test is carried out on the basis of the rank data (rank A) by use of the test criteria corresponding to the rank classification in ST21. Test criteria used in the product test are harder than the test criteria of rank A used in the rank classification in ST21. In detail, it is mentioned in FIG. 3 by using a specific example.

ST27 and ST28 are basically as the same as ST26. However, the test criteria corresponding to the rank data 11 used in ST27 and ST28 are different from that used in ST26.

FIG. 3 shows a table showing a rank classification and test criteria of a rank test in the test method of the semiconductor device according to the first embodiment of the present invention. This figure mainly illustrates pause time of DRAM in the DRAM portion 12. For example, it is demonstrated that the data are classified into four ranks (rank A-rank D) on the basis of three test criteria.

In FIG. 3, a left column demonstrates the test criteria used in the rank classification (ST21), a right column demonstrates the test criteria used in the product test (ST26-ST28) and the central column demonstrates the rank data 11 corresponding to the test criteria.

The test criteria classifying into the ranks in ST21 are 136 ms, 264 ms and 1032 ms as shown in FIG. 3. In ST21, a pose test is firstly performed under the criterion of 1032 ms. A chip passed in the 1032 ms-test is classified into rank A.

Next, a pose test is performed under the criterion of 264 ms. A chip passed in the 264 ms-test is classified into rank B. Furthermore, a pose test is performed under the criterion of 136 ms. A chip passed in the 136 ms-test is classified into rank C. A chip not passed in the 136 ms-test is classified into rank D. Since the chip passed through conventional pre-D/S test, for example, the 64 ms-test, the chip is not classified into a defective chip. Moreover, the rank data 11 are written into the fuse portion 15 of the chip in ST22.

The test criteria of the product test in ST26-28 are 128 ms, 256 ms, and 1024 ms as shown in FIG. 3. For example, when the rank data 11 read out in ST25 are rank A, a pose test is performed in ST26 by using the criterion of rank A, such as 1024 ms.

Similarly, when the rank data 11 are rank B, a pose test is performed in ST27 by using the criterion of rank B, such as 256 ms. Further, when the rank data 11 are rank C, a pose test is performed in ST28 by using the criterion of rank C, such as 128 ms. In the case of rank D, the product test is not performed and the chip is retained for a special specification.

In ST21, a range of the test criteria on the rank classification is wider than that on the product test. Because the test environment on wafer state is different from the test environment on package state, a hard test leads to produce a dropped chip on the product test. Accordingly, it is necessary to release the criterion to the chip which may pass in ST21.

According to the first embodiment, since the rank-classification test is performed on wafer state in D/S test, yield of the semiconductor device can be greatly improved in the product test.

Furthermore, according to the first embodiment, since the chips are classified by the rank data 11 before the product test, a number of the chips are managed by the rank. As a result, faster correspondence can be performed when a specification of user requirement is different from a general specification.

In the first embodiment, the function unit 14 is composed of the DRAM portion 12 and the logic circuit 13, however, the present invention is not limited the above case. A function unit having a circuit portion with a test item classifying into the ranks by using plurality of the test criteria can be principally applied.

In the first embodiment, the fuse portion 15 is the electrical fuse, however, the present invention is not limited the above case. For example, non-volatile memories, such as a laser fuse, EEPROM (Electrical Erasable PROM) or the like can be used.

Furthermore, in the first embodiment, the control circuit 16 of the fuse portion 15 is the test only circuit, however, the present invention is not limited the above case. For example, a circuit in a function unit can be used as a test circuit.

Moreover, in the first embodiment, the test item classifying into the ranks in ST21 is explained, for example, by use of pause time of DRAM in the DRAM portion 12, however, the present invention is not limited the above case. A function unit having a circuit portion with a test item classifying into the ranks by using a plurality of test criteria is principally applied. Further, classifying into the ranks is carried out by three test criteria, however, the present invention is not limited the above case.

Furthermore, in the first embodiment, the rank test in ST21 is sequentially performed from the harder criterion in order, however, the present invention is not limited the above case. For example, the rank test in ST21 may be first performed by a softer criterion and may sort rank D.

A constitution and a function of a semiconductor device according to a second embodiment of the present invention are basically the same as those of the semiconductor device according to the first embodiment. Accordingly, the same reference numerals are applied to the same parts and elements throughout the drawings, and the description of the same parts and elements are omitted.

Figures 4, 5:
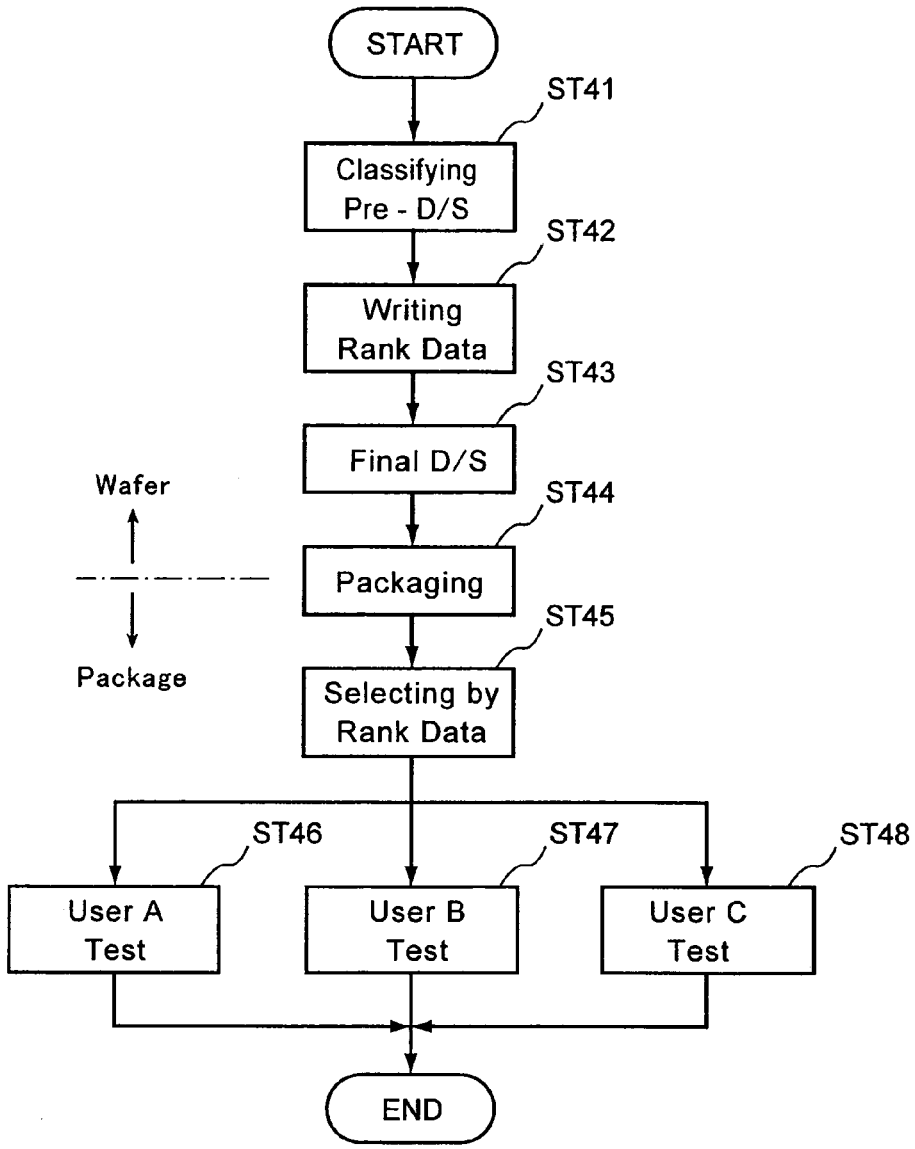
FIG. 4 shows a flowchart showing a test method of a semiconductor device according to a second embodiment of the present invention.
FIG. 5 shows a table showing a rank classification and test criteria of a rank test in the test method of the semiconductor device according to the second embodiment of the present invention.

FIG. 4 shows a flowchart showing a test method of the semiconductor device according to the second embodiment of the present invention. This figure mainly illustrates a portion regarding a rank-classification test in D/S test and a user test in a product test. For example, it is demonstrated that different product tests are performed on the basis of three user specifications (user A-user C).

As shown in FIG. 4, tests in ST41-ST43 are carried out on wafer state and tests ST46-ST48 are carried out on package state.

The test method of the semiconductor device according to the second embodiment of the present invention includes a wafer test step (ST41), a writing step (ST42), a final D/S step (ST43), a packaging step (ST44), a sorting step (ST45) and a user test step (ST46-ST48).

Since ST41-ST44 is the same as ST21-ST24 as shown in FIG. 2 in the first embodiment, the explanation on ST41-ST44 are omitted. The difference between the first embodiment and the second embodiment is performing a rank classification regarding a plurality of test items in ST41.

FIG. 5 shows a table showing a rank classification and test criteria of a rank test in the test method of the semiconductor device according to the second embodiment of the present invention. This figure mainly illustrates access time of DRAM in the DRAM portion 12 as another test item. For example, it is demonstrated that the data are classified into four ranks (rank A-rank D) and a product test is carried out. Since a constitution of the table is the same as that in FIG. 2, the explanation is omitted in detail.

In ST45, a chip being performed the product test for each user is sorted on the basis of user specification. The test item regarding sorting the chip is the test item used as the rank classification in ST41. The product test (ST46-ST48) for a specific user is sorted by combining the rank data 11.

FIG. 6 shows a table showing a rank classification and test criteria of a rank test in the test method of the semiconductor device according to the second embodiment of the present invention. This figure mainly illustrates a classification by combining pause time and access time of DRAM in the DRAM portion 12, for example.

FIG. 6 (a) shows requirement values of pause time and access time by users (user A-user C). FIG. 6 (b) shows a combination of the rank data 11 of a chip being performed a product test (ST46-ST48) for each user.

In ST46, the chip sorted on the basis of a requirement specification by user A in ST45 is tested on the product test by the requirement specification in addition to a conventional product test. In the requirement specification as shown in FIG. 6(a), a chip set rank D in pause time and rank A in access time is sorted on ST45 and is tested on the product test for user A.

Similarly, a requirement specification by user B is used in ST47 and a requirement specification by user C is used in ST48.

According to the second embodiment, the rank classification is performed for a plurality of test items in D/S test. Accordingly, when requirement specification of an user differs from a conventional specification, yield of the semiconductor device can be greatly improved in the product test and a product for a specific user can be shipped by a short delivery period in addition to the effects of the first embodiment.

In the second embodiment, the chip is sorted by combining pause time and access time of DRAM in DRAM portion 12 in ST45 as simplifying explanation, however, the present invention is not limited the above case. A function unit having a circuit portion with a test item classifying into the ranks by using a plurality of the test criteria can be principally applied. A test item having a capability of the rank classification in ST41 can be principally combined in arbitrary number.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the claims that follow. The invention can be carried out by being variously modified within a range not deviated from the gist of the invention.

What is claimed is:

1. A semiconductor device, comprising:
   a function unit portion including a circuit element;
   a non-volatile memory portion in which rank data are stored, the rank data presenting results of a rank-classification test on the circuit element, the rank-classification test being performed on the basis of a plurality of test criteria as wafer state; and
   a control portion reading out the rank data from the non-volatile memory portion, the control portion being used in a product test after packaging.

2. The semiconductor device according to claim 1, wherein the circuit element is DRAM.

3. The semiconductor device according to claim 1, further comprising:
   a logic circuit being included in the function unit portion.

4. The semiconductor device according to claim 1, wherein the non-volatile memory portion is a fuse or a non-volatile memory.

5. The semiconductor device according to claim 1, wherein the control portion is composed of a proper circuit portion.

6. The semiconductor device according to claim 1, wherein the control portion is included in the function unit portion.

7. A test method of a semiconductor device, comprising:
   performing a rank-classification test on a circuit element included in a chip as wafer state on the basis of a plurality of test criteria; and
   writing results of the rank-classification test as rank data into a non-volatile memory portion included in the chip so that the rank data are stored in the non-volatile memory portion.

8. The test method according to claim 7, further comprising:
   reading out the rank data from the non-volatile memory portion in the chip packaged after the writing the results of the rank-classification test as the rank data; and
   performing a product test using the test criteria on the basis of the rank data, each one of the test criteria having the different rank.

9. The test method according to claim 7, wherein the rank data includes the results of the rank-classification test, the rank-classification test being performed corresponding to a plurality of test items.

10. The test method according to claim 8, further comprising:
    sorting a chip on the basis of the rank data by combination of the plurality of test items after the reading out the rank data from the non-volatile memory portion in the chip packaged; and
    performing a product test on the chip by using the test criteria corresponding to the rank data.

11. The test method according to claim 8, wherein the circuit element is DRAM.

12. The test method according to claim 11, wherein the rank-classification test includes access time of DRAM.

13. The test method according to claim 11, wherein the rank-classification test includes pause time of DRAM.

14. The test method according to claim 7, wherein the rank-classification test includes a plurality of items.

15. The test method according to claim 7, wherein the non-volatile memory portion is a fuse or a non-volatile memory.

16. The test method according to claim 7, further comprising:

sorting the chip packaged by using the rank data after the writing the results of the rank-classification test as the rank data; and performing a product test on the basis of the sorting by using test criteria of user requirement specifications.

17. The test method according to claim 16, wherein the user requirement specifications are constituted by a combination of a plurality of different ranks.

* * * * *